United States Patent
Bruekers et al.

(10) Patent No.: US 7,197,079 B2
(45) Date of Patent: *Mar. 27, 2007

(54) TRANSMITTING DEVICE FOR TRANSMITTING A DIGITAL INFORMATION SIGNAL ALTERNATELY IN ENCODED FORM AND NON-ENCODED FORM

(75) Inventors: Alphons A. M. L. Bruekers, Eindhoven (NL); Johannes M. M. Verbakel, Eindhoven (NL); Marcel S. E. Van Nieuwenhoven, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 39 days.

This patent is subject to a terminal disclaimer.

(21) Appl. No.: 10/298,975

(22) Filed: Nov. 18, 2002

(65) Prior Publication Data

US 2003/0076893 A1 Apr. 24, 2003

Related U.S. Application Data

(63) Continuation of application No. 09/270,440, filed on Mar. 16, 1999, now Pat. No. 6,522,695.

(30) Foreign Application Priority Data

Mar. 19, 1998 (EP) .............................. 98200870 U
Dec. 7, 1998 (EP) .............................. 98204150 U

(51) Int. Cl.
*H04L 27/00* (2006.01)

(52) U.S. Cl. ..................................................... 375/259

(58) Field of Classification Search ................ 375/259, 375/265, 341, 785, 240.25, 240.27, 285, 375/240.24; 714/759, 791, 795, 752
See application file for complete search history.

(56) References Cited

U.S. PATENT DOCUMENTS 4,706,265 A 11/1987 Furukawa (Continued)

FOREIGN PATENT DOCUMENTS

EP 0707425 A2 4/1996

OTHER PUBLICATIONS

AES Preprint 4563 "Improved Lossless Coding of 1-Bit Audio Signals" by Fons Bruekers et al, 103rd AES Convention (New York, US).

(Continued)

*Primary Examiner*—Emmanuel Bayard
(74) *Attorney, Agent, or Firm*—Michael E. Belk

(57) ABSTRACT

A transmitter is disclosed for transmitting a digital information signal via a transmission medium. The digital information signal can be divided into one or more sub-signals. Each sub-signal is transmitted as a non-encoded or as an encoded signal. In which way the sub-signal is transmitted depends on the compression that can be achieved by the encoder. If the compression is low the sub-signal is transmitted in non-encoded form. For the receiver an identification is added to the composite signal to be transmitted. A first component of the identification signal indicates if one or more sub-signals are transmitted in encoded form. A second component of the identification signal indicates for each sub-signal whether it appears in encoded or non-encoded form in the composite signal. The invention provides a composite signal with a minimal number of bits.

19 Claims, 3 Drawing Sheets

U.S. PATENT DOCUMENTS

| | | | |
|---|---|---|---|
| 6,055,338 A * | 4/2000 | Endo et al. | 382/247 |
| 6,189,123 B1 * | 2/2001 | Anders Nystrom et al. | 714/751 |
| 6,304,609 B1 * | 10/2001 | Stephens et al. | 375/259 |
| 6,353,613 B1 * | 3/2002 | Kubota et al. | 370/389 |
| 6,522,695 B1 * | 2/2003 | Bruekers et al. | 375/259 |

OTHER PUBLICATIONS

Australian Patent Office Written Opinion, Feb. 2, 2000.

* cited by examiner

TRANSMITTING DEVICE FOR TRANSMITTING A DIGITAL INFORMATION SIGNAL ALTERNATELY IN ENCODED FORM AND NON-ENCODED FORM

CROSS-REFERENCE TO RELATED APPLICATIONS

This is a continuation of application Ser. No. 09/270,440 filed Mar. 16, 1999, and issued as U.S. Pat. No. 6,522,695.

The invention relates to a transmitting device for transmitting a digital information signal via a transmission medium, comprising:
  input means for receiving the digital information signal,
  means for encoding the digital information signal and generating an output signal.

The invention further relates to a receiving device for receiving a composite signal via a transmission medium, to a method of transmitting a digital information signal via a transmission medium, and to a record carrier carrying a digital information signal having portions which have been or have not been encoded by a given encoding method.

A transmitting and receiving device of the type defined in the opening paragraphs is known from the AES preprint 4563 "Improved Lossless Coding of 1-Bit Audio Signals" by Fons Bruekers et al, 103rd AES Convention (New York, US). The known transmitting device is intended for efficiently reducing the bit rate for the transmission of a digital information signal. A composite signal thus obtained includes an encoded version of the digital information signal. On an average, the composite signal obtained by means of the known transmitting device contains less bits than a composite signal in which the digital information signal has not been encoded.

It is an object of the invention to provide a transmitting and/or receiving device which transmits a digital information signal with a smaller or at the most equal number of bits. The invention also enables more information to be stored on a record carrier.

To this end, a transmitting device in accordance with the invention is characterized in that the transmitting device further comprises:
  control means for generating a control signal to be applied to the encoding means, in that the encoding means are adapted to generate portions of the output signal in the form of encoded portions of the digital information signal under the influence of a control signal of a first type, and are adapted to generate portions of the output signal in the form of portions of the digital information signal under the influence of a control signal of a second type, and in that the transmitting device further comprises:
  means for generating a first identification signal of a first type which indicates that the output signal possibly includes a portion of the digital information signal which has been encoded in the encoding means, and a first identification signal of a second type which indicates that the output signal does not include any portions of the digital information signal which have been encoded by the encoding means,
  means for generating, for a portion of the digital information signal, a second identification signal of a first type in dependence on the control signal of the first type and the first identification signal of the first type, and a second identification signal of a second type in dependence on the control signal of the second type and the first identification signal of the first type,
  combining means for combining the output signal of the encoding means, the first identification signal and, if the first identification signal is of the first type, the second identification signal so as to obtain a composite signal to be applied to the transmission medium.

A receiving device in accordance with the invention is characterized in that the demultiplexing means are also adapted to derive a first identification signal of a first type and a second type from the composite signal, in that th decoding means are adapted to decode a signal portion into a portion of the digital information signal and to supply said portion of the digital information signal in dependence on a control signal of a first type and to supply a signal portion as a portion of the digital information signal in a substantially unmodified form in dependence on a control signal is of a second type, and in that the receiving device further comprises:
  means for generating the control signal for application to the decoding means, which first-mentioned means generate a control signal of the first type in dependence on the first identification signal of the first type.

A method in accordance with the invention is characterized in that the method further comprises the steps of:
  generating a control signal,
  generating portions of an output signal in the form of encoded portions of the digital information signal under the influence of a control signal of a first type,
  generating portions of the output signal in the form of portions of the digital information signal under the influence of a control signal of a second type,
  generating a first identification signal of a first type which indicates that the output signal possibly includes a portion of the digital information signal which has been encoded in the encoding means, or a first identification signal of a second type which indicates that the output signal does not include any portions of the digital information signal which have been encoded by the encoding means,
  generating a second identification signal of a first type in dependence on the control signal of the first type and a first identification signal of the first type,
  generating a second identification signal of a second type in dependence on the control signal of the second type and the first identification signal of the first type,
  combining the output signal of the encoding means, the first identification signal and, if the first identification signal is of the first type, the second identification signal so as to obtain a composite signal,
  applying the composite signal to the transmission medium.

A record carrier in accordance with the invention carries a digital information signal having portions which have been or have not been encoded by means of a given encoding method, further carrying a first identification signal which is of a first type which indicates that the record carrier possibly carries a portion of the digital information signal encoded by means of the given encoding method.

The invention is based on the recognition of the fact that by the use of an encoder the number of bits required to transmit a digital information signal is not always reduced. In the encoder some signals give rise to an output signal which requires more bits for the representation of the digital information signal than the digital information signal itself. In the device and the method in accordance with the invention, in order to preclude this increase, the representation having the smaller number of bits is transmitted together with an identification signal, which indicates whether or not the signal has been encoded by a given encoding method. A record carrier can store a maximum number of bits. If the record carrier is obtained by means of the method in accordance with the invention it can store a composite signal with a larger digital information signal.

These and other aspects of the invention will be described in more detail with reference to FIGS. 1 to 8.

Figure 1:
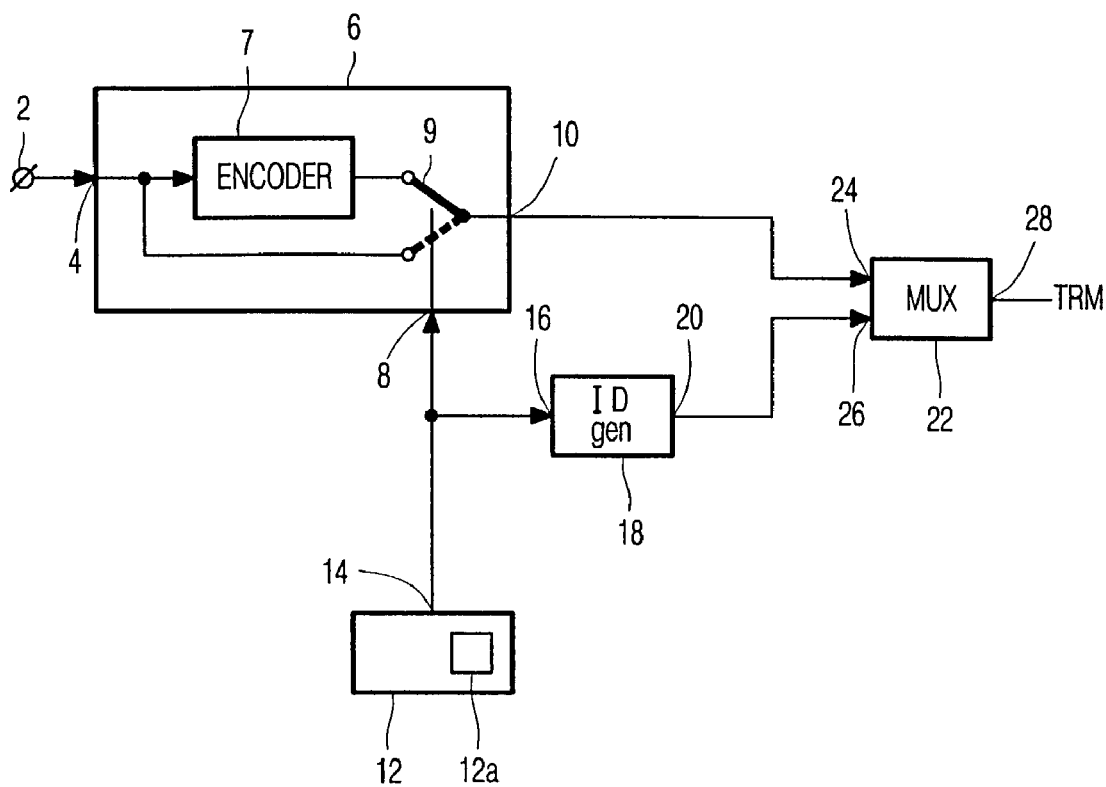
FIG. 1 is a block diagram of a first embodiment of a transmitting device in accordance with the invention.

FIG. 1 is a block diagram of a first embodiment of a transmitting device in accordance with the invention. The transmitting device has an input terminal 2 for receiving a digital information signal such as a digital audio signal. The digital audio signal may have been obtained by converting an analog version of the digital audio signal into the digital information signal in an A/D converter. The digital information signal may take the form of 1-bit signals, such as a bitstream. It is also possible that the digital information signal received via the input terminal has been obtained by means of a plurality of pre-processing operations, not shown. The pre-processing operations may include, for example, an encoding method. The digital information signal may comprise one or a plurality of signal portions. One signal portion of the digital information signal can, for example, be the information recorded in one track on the record carrier, or a group comprising a number of samples of the digital information signal. The signal portions together constitute the digital information signal. A digital information signal is, for example, all the audio information recorded on a record carrier or a music item which is transmitted via a transmission medium. The input terminal 2 is coupled to an input 4 of encoding means 6. The encoding means comprise an encoder 7 adapted to convert the signal received at the input 4 into an encoded signal. The encoding means may comprise a lossless encoder as described in the AES preprint 4563 "Improved Lossless Coding of 1-Bit Audio Signals" by Fons Bruekers et al, 103rd AES Convention (New York, US). Alternatively, the encoding means may comprise a lossy encoder. The encoding means 6 are also adapted to supply an output signal to an output 10. Depending upon a control signal applied to a control input 8 a switching element 9 couples an output of the encoder 7 or the input 4 to the output 10, as a result of which the output signal comprises the encoded signal or the signal received at the input 4.

The encoding means may also comprise an encoder 7 which supplies the digital information signal to the output of the encoder in a modified or unmodified form depending on the coefficients used in the encoder. For example, in the Application EP 98200869 (PHN 16.831), not yet published at the time of filing of the present Application, an arithmetic encoder is described which in the case of a coefficient having the value 0.5 applies the signal received at the input of the arithmetic encoder to the output of the arithmetic encoder in a substantially unmodified form. By the selection of suitable coefficients in the encoder in dependence on the control signal, the encoder can apply an encoded digital information signal or a substantially unmodified digital information signal to the output. The encoding means 6 then do not include a switching element as shown in FIG. 1.

The embodiment shown in FIG. 1 also has control means 12 for applying the control signal to the control input 8 of the encoder 6 and to a control input 16 of the means 18 for deriving an identification signal. The control means 12 may take the form of an input terminal. However, the control means 12 may alternatively include means 12a adapted to determine the data reduction which is achieved or can be achieved by the conversion of the signal into the encoded signal in the encoder 7. For example if an entropy encoder is used in the encoder it is possible to determine with satisfactory probability the degree of data reduction of the signal caused by encoding with the aid of the statistical distribution of a signal applied to the input of the entropy encoder and/or the probability table used by the entropy encoder. When a prior estimate is made it is not necessary to wait until the signal has been encoded in order to determine the data reduction. As a result of this, a digital information signal can be processed and transmitted more rapidly by the transmitting device. The means 12a can determine the data reduction of both the digital information signal and the individual signal portions. Subsequently, the data reduction is compared with a predetermined factor. If encoding leads to a data reduction greater than a predetermined factor a control signal of the first type is generated. If encoding leads to a data reduction smaller than the predetermined factor a control signal of the second type is generated.

The means 18 are adapted to derive an identification signal in dependence on the control signal received at the input 16. The identification signal is applied to an output 20. The means 18 are further adapted to indicate in the identification signal whether the encoding means supply a signal to the output 10 of the encoding means 6 in an encoded form or substantially unmodified. The identification signal comprises a first component which indicates that possibly a signal portion of the digital information signal is supplied to the output 10 of the encoding means 6 in an encoded form. If the identification signal includes this first component the identification signal also includes a second component which indicates for each of the signal portions whether the signal is supplied to the output 10 of the encoding means 6 in an encoded form or substantially unmodified.

The combining means 22 have a first input 22 coupled to the output 10 of the encoding means 6, a second input 26 coupled to the output 20 of the means 18 for generating the identification signal, and an output 28. The combining means are adapted to generate a composite signal from the output signal of the encoding means 6 and the identification signal. The composite signal is applied to the output 28 in order to be transmitted via a transmission medium TRM.

The transmitting device as described hereinbefore operates as follows. The digital information signal is applied to the input terminal 2 and is supplied to the encoding means 6. The control means 12 apply a control signal to the encoding means 6. If the control signal of the first type is received the output signal of the encoding means contains the encoded signal. If the control signal of the second type is received the switching means 9 couple the input 4 of the encoding means 6 to the output 10 of the encoding means 6.

The output signal of the encoding means 6 then contains the digital information signal. The control signal can be defined externally. For example, for some types of digital information signals it is known that encoding these digital information signals leads to an increased number of bits. The digital information signal is then expanded rather than compressed. This is undesirable because this expansion may give rise to problems. These problems may be, for example, an inadequate storage capacity or an insufficient bandwidth in order to transmit the digital information signal via the transmission medium. A control signal of the second type is applied when it is known that encoding of the digital information signal does not yield the desired data reduction. The digital information signal is then not applied to the combining means 22 in an encoded form. However, when it is known that encoding leads to a significant data reduction a control signal of the first type will be applied. The means 18 generate the identification signal corresponding to the relevant control signal. The combining means combine the output signal of the encoding means 6 and the identification signal to a composite signal. Subsequently, the composite signal is transmitted via the transmission medium. By selecting that version of the digital information signal having the smaller number of bits in the composite signal the transmitting device will make optimum use of the storage capacity on a record carrier or will make optimum use of the bandwidth of a transmission medium.

In the preceding paragraph it has been described how a digital information signal is transmitted by means of the transmitting device in accordance with the invention. The digital information signal is then regarded as one signal. However, the digital information signal may comprise a plurality of signal portions. A signal portion may be one music item but may alternatively be a group of consecutive samples of the digital information signal. The transmitting device in accordance with the invention also enables each individual signal portion to be transmitted coded or not coded by means of the encoder. The transmitting device then includes means 12a which, for the whole digital information signal and/or each individual signal portion, determine which manner requires the least number of bits for transmitting the digital information signal via the transmission medium. For some of the signal portions encoding will lead to data reduction. For other signal portions encoding will lead to a data increase. The control signal will then alternately be of the first type or the second type, in such a manner that the signal portions for which the data reduction provided by the encoder is unsatisfactory do not appear in encoded form in the output signal of the encoder 6 and the other signals portions do appear in encoded form in the output signal. The identification signal now includes a first component which indicates that possibly one signal portion appears in encoded form in the composite signal. Moreover, there is a second component which for each of the portions specifies whether the signal portion appears in an encoded form or not in this encoded form in the composite signal.

Figure 2:
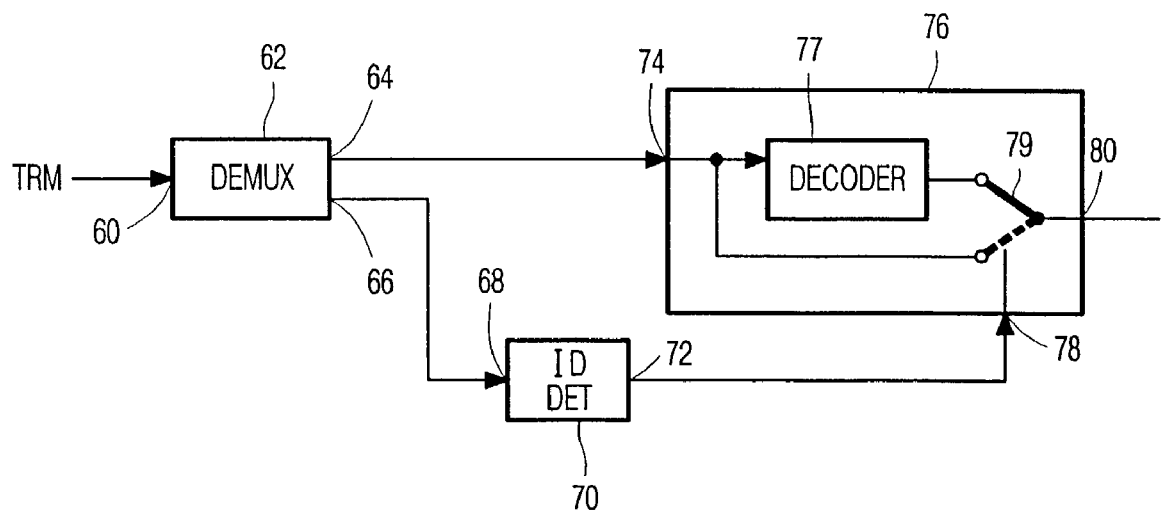
FIG. 2 is a block diagram of an embodiment of a receiving device in accordance with the invention.

FIG. 2 shows an embodiment of a receiving device in accordance with the invention for receiving a composite signal TRM. A version of the digital information signal is derived from the composite signal. An exact or a non-exact copy of the digital information signal will be derived in dependence on the coding used in the transmitting device. The composite signal is received at the input 60 of demultiplexing means 62. The demultiplexing means are adapted to derive an output signal and an identification signal from the composite signal. The output signal contains a version of the digital information signal and is applied to an output 64.

The version of the digital information signal may comprise one or more signal portions of the digital information signal. A signal portion can be a track of a disc or a group of consecutive samples of the digital information signal. The identification signal, which specifies how the version of the digital information signal has been encoded, is supplied to an output 66. The identification signal specifies for each signal portion whether or not it has been encoded.

The identification means 70 have an input 68 coupled to the output 66 of the demultiplexing means 62. The identification means 70 are adapted to derive a control signal from the identification signal, which control signal is to be transferred to a control output 72. A control signal of a first type is derived from the identification signal when the corresponding portion of the output signal at the output 64 of the demultiplexing means 62 has been encoded by means of an encoder. A control signal of a second type is derived from the identification signal when the corresponding portion of the output signal at the output 64 of the demultiplexing means 62 has not been encoded by means of this encoder.

The decoding means 76 have an input 74 coupled to the output 64 of the demultiplexing means 64. A control input 78 is coupled to the control output 72 of the identification means. The decoding means 76 comprise a decoder 77 adapted to decode the signal received at the input 74 into a decoded signal, and they comprise switching means 79. Depending on the control signal applied to the control input 78 the switching means 79 couple an output of the decoder 77 or the input 74 to the output 80, as a result of which the output signal of the decoding means include a decoded version of the signal received at the input 74, or the signal received at the input 74. If the transmitting device uses a lossless coding the signal applied to the output 80 will be an exact copy of the digital information signal applied to the input of the transmitting device. The decoder can be a lossy decoder or a lossless decoder. An example of a lossless decoder is described in the AES preprint 4563 "Improved Lossless Coding of 1-Bit Audio Signals" by Fons Bruekers et al, 103rd AES Convention (New York, US). The decoded signal is applied to the output 80 in response to a control signal of the first type. The signal is received at the input 74 is applied to the output 80 in substantially unmodified form in response to a control signal of the second type. A signal may comprise a signal component of the digital information signal or the entire digital information signal. The decoding means 76 has its output 80 coupled to the output terminal 82.

The receiving device shown in FIG. 2 operates as follows. In the demultiplexing means a version of the digital information signal and an identification signal are derived from the composite signal. The identification means derive a control signal from the identification signal. The identification signal has a first component which indicates whether possibly one or several portions of the version of the digital information signal appear in the version encoded in a given manner. If the first component is not present the version of the digital information signal is the version of the digital information signal which has not been encoded in the given manner. The first component can be recorded in a Table of Content, Track List or Block Header of, for example, a record carrier in the form of an optical disc. If the first component is present the identification signal comprises a second component. The second component specifies how the corresponding signal portion appears in encoded form in the version of the digital information signal. The control signal is generated in dependence on the first and the second component. The control signal determines whether or not the signal applied to the input 74 must be decoded before it is applied to the output 80.

Figure 3:
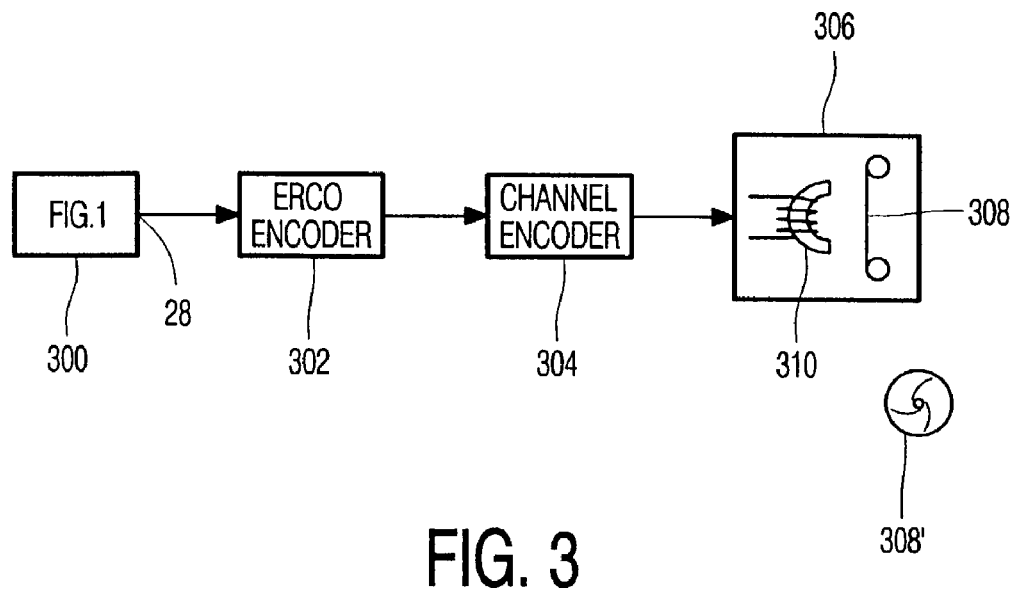
FIG. 3 is a block diagram of a transmitting device in the form of a recording apparatus.

FIG. 3 shows a transmitting device in the form of an apparatus for recording the digital information signal on a record carrier. The circuit block 300 in FIG. 3 is equivalent to the block diagram of FIG. 1. The output 28 of the circuit block 300 corresponds to the output 28 of the combining means 30 in FIG. 1. The recording apparatus further includes an error correction encoder 302, a channel encoder 304 and write means for writing the signal onto the record carrier 308. Error correction encoders and channel encoders are generally known from the prior art. The record carrier 308 can be of the magnetic type. In the present case the write means 306 comprise one or several magnetic heads 310 adapted to record the information in a track on the record carrier 308. In another embodiment the record carrier 308 is an optical information carrier 308'. The write means 306 now comprise an optical recording head 310 for recording the information in a track on the record carrier 308'.

Figure 4:
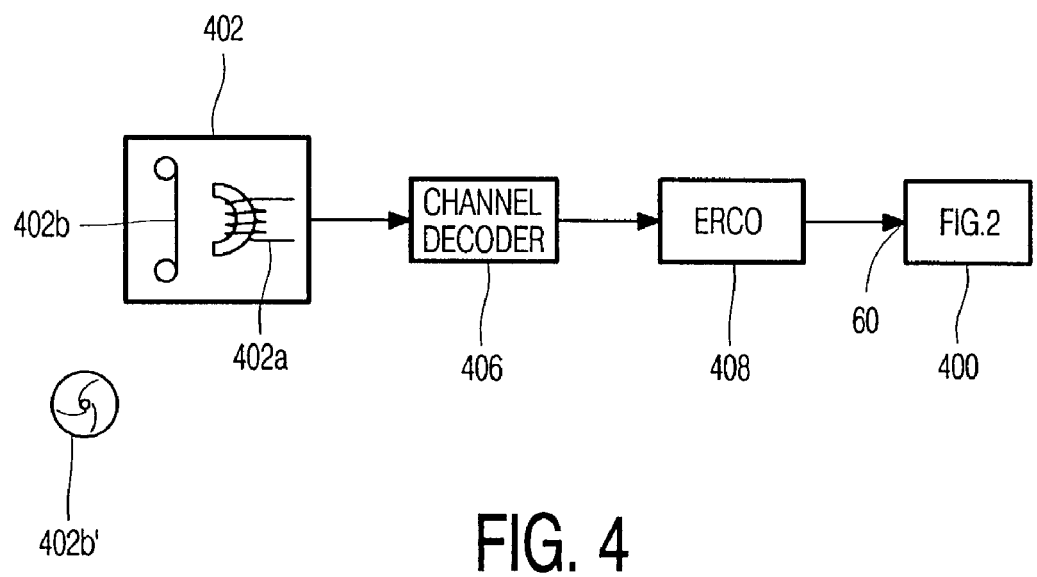
FIG. 4 is a block diagram of a receiving device in the form of a reproducing apparatus.

FIG. 4 shows a receiving device in the form of an apparatus for reproducing the digital information signal on the record carrier. The circuit block 400 in FIG. 4 is equivalent to the block diagram of FIG. 2. The input 60 of the circuit block 400 corresponds to the input 60 of the demultiplexing unit 62 in FIG. 2. The reproducing apparatus further includes read means 402, a channel decoder 406 and means for detecting and, if p correcting errors in the signal. Channel decoders and error detection/correction means are generally known from the prior art. The read means 402 are adapted to read the signal recorded on the record carrier 402*b* and to supply the signal thus read to a channel decoder 406. The record carrier 402*b* can be of the magnetic type. In the present case the read means 402 comprise one or several magnetic read heads 402 for reading the information from a track on the record carrier 402*b*. In another embodiment the record carrier 402*b* is an optical information carrier 402'. The read means 402 now comprise an optical read head 402*a* for reading the information from a track on the record carrier 402*b'*.

A transmitting device and a receiving device in accordance with the invention often process the signals in a byte-oriented fashion. The first component of the identification signal can be recorded, for example, the Table of Content, Track List or Block Headers. The second component of the identification signal can be recorded at the beginning of each signal portion in the composite signal, for example at the beginning of each frame. A frame comprises a part of the digital information signal and the parameters intended for the receiving device. As a result of the byte-oriented processing, it is desirable that each frame begins at a boundary of a byte or a plurality of bytes. When a signal portion appears in the composite signal in an encoded form this portion in the composite signal may start with parameters which specify how the subsequent group of bits in the signal should be decoded. In the present case, the bits are processed separately and, consequently, the second component may comprise only one bit for this signal portion. The number of bits of an encoded signal need not correspond to an integral number of bytes. In order to ensure that the next portion of the composite signal begins at a byte boundary it may be necessary to insert a number of bits at the end of the encoded signal in the composite signal. When a signal portion appears in the composite signal in a non-encoded form, i.e. in the original form, the second component may require one bit or one byte of space per signal portion depending on the signal processing that is used. In the case that a byte-oriented signal processing is used and a signal portion comprises an integral number of bytes, the second component preferably occupies one byte of space. As a result of this, the boundaries of portions of the composite signal remain at the byte boundaries.

Figure 5:
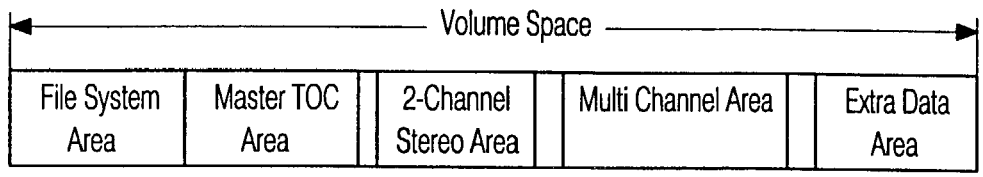
FIG. 5 shows a structure of a Volume Space on a record carrier.

FIG. 5 shows a structure of the volume space on a record carrier in accordance with the invention. The volume space on the record carrier has been divided into: a File System Area, Master TOC, 2-Channel Stereo Area, Multi Channel Area and Extra Data Area. The 2-Channel Stereo Area and the Multi Channel Area are referred to as Audio Areas. Each record carrier should have the Master TOC Area and at least one Audio Area. The record carrier may optionally have a File System Area. The File Systems Area then comprises a file system in accordance with the ISO 9660 and/or the UDF specification. ISO 9660 specifies the volume and file structure of record carriers in the form of a CD-ROM. The Extra Data Area may at option be used for storing audio-related information. If the record carrier has an Extra Data Area the record carrier should have a UDF and/or ISO 9660 file. The data in the Extra Data Area can be addressed via the file system. The file system is stored in the File System Area. If the File System Area is not large enough to store the file system the remainder of the file system can be stored in the Extra Data Area.

The Master TOC Area comprises three identical copies of the Master TOC. The Master TOC describes the record carrier at the highest level. The three copies of the Master TOC are situated at the some location on each record carrier and have a fixed size of 10 sectors. A sector has a size of 2048 bytes. The first sector comprises general information about the record carrier, such as the size and the location of the Audio Areas on the record carrier, album information, catalog number, type of record carrier and the date of the record carrier.

Figure 6:
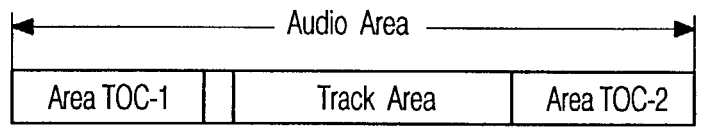
FIG. 6 shows a structure of an audio Area on a record carrier.

FIG. 6 shows a structure of an Audio Area on the record carrier. The Audio Area comprises a Track Area having Audio Tracks containing audio information, and an Area TOC with control information. All 2-channel stereo Tracks are arranged in the 2-channel stereo Area. All Multi Channel Tracks are arranged in the Multi channel Area. Each Audio Area comprises an Area TOC-1, a Track Area with Audio tracks and an Area TOC-2. The content of the Area TOC-1 and of the Area TOC-2 is identical and comprises a copy of the Area TOC. The location of the Area TOC-1 and the Area TOC-2 of each Audio Area is defined in the Master TOC.

Figure 7:
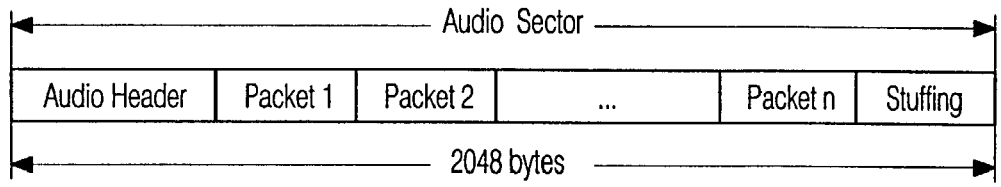
FIG. 7 shows a layout of an Audio Sector on a record carrier.

The information stored in a Track Area is a Byte Stream. A Byte Stream is stored in an integral number of sectors. A sector used by a Byte Stream is called an Audio Sector. A Byte Stream is divided into Multiplexed Frames having a duration of 01/75 second. A Byte Stream comprises an integral number of Multiplexed Frames and is the succession of all Multiplexed Frames in an Audio Area. FIG. 7 shows a layout of an Audio Sector. An Audio Sector comprises a fixed number of bytes, for example 2048 bytes. Each Audio Sector begins, with an Audio Header and is followed by a at least one Packet. If the last byte of a Packet in an Audio Sector does not lie within the last byte of an Audio Sector Stuffing bytes are added up to the last byte of an Audio Sector. A Packet can contain only one of the following data types, namely Audio Data, Supplementary Data or Padding Data. A Packet of Audio Data is called an Audio Packet. A Packet of Supplementary Data is called a Supplementary Packet. A Packet of Padding Data is called a Padding Packet. A packet can belong to only one Audio Sector. An Audio Sector should comprise at least one packet. An Audio Sector comprises a maximum of seven Packets.

A Multiplexed Frame comprises an integral number of Packets. A Multiplexed Frame should comprise at least one Audio Packet. In addition, a Multiplexed Frame may comprise Supplementary Data Packets and Padding Packets. An Audio Frame comprises the concatenated Audio Packets in a Multiplexed Frame. A Supplementary Data Frame comprises the concatenated Supplementary Data Packets in a Multiplexed Frame. A Padding Frame comprises the concatenated Padding Packets in a Multiplexed Frame. Audio Frames, Supplementary Data Frames and Padding Frames are referred to as Elementary Frames.

Each Multiplexed Frame has a time code expressed in minutes, seconds and sequence number of the frame in the second. The first Audio Frame in the Track Area of an Audio Area has the time code 0. The time code is incremented in each subsequent Multiplexed Frame in the entire Track Area.

Figure 8:
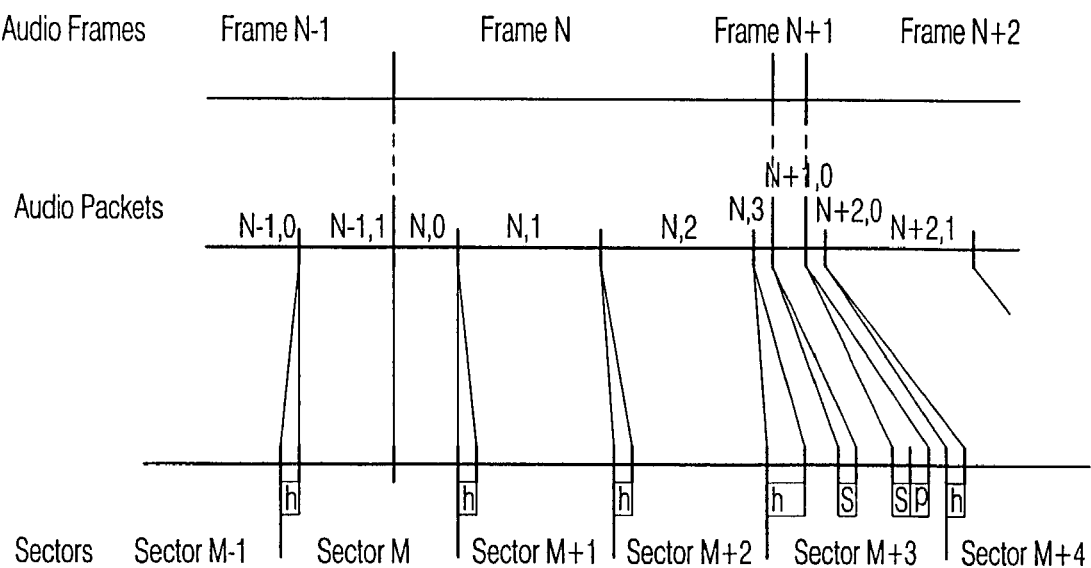
FIG. 8 shows the relationship between Multiplexed Frames and Audio Sectors.

FIG. 8 shows the relationship between Multiplexed Frames and Audio Sectors. The Audio Frames are shown at the top. The Audio Frames can be of different lengths in the case that the Audio Frames have been obtained by lossless coding. These Audio Frames are divided into Audio Packets. In FIG. 8 the Audio Frames N are divided into four Packets (N,0), (N,1), (N,2) and (N,3). The Audio Packets are subsequently arranged in the Audio Sectors. As stated hereinbefore, each Audio Sector begins with an Audio Header, followed by at least one Packet. In FIG. 8 the Supplementary Data Packets are referenced S, the Padding packets are referenced p, and the Audio Headers are referenced h. Thus, in FIG. 8 the Audio Sector M+3 comprises an Audio Header, Audio Packet (N,3), Supplementary Data Packet N, Audio Packet (N+1,0), Supplementary Data Packet N+1, Padding Frame N+1 and Audio Frame (N+2,0).

The Area TOC comprises control information for the Track Area of the Audio Area belonging to the Area TOC. Control information can be, for example: the Byte_Rate of the Multiplexed data in the Audio Area expressed as the number of bytes per second, the sample rate used for the Audio Area, and the frame format. The frame format defines the frame structure of the multiplexed audio signal in the Track Area. Possible types of frame formats are, for examples: Multi Channel flexible Format plain DSD, Fixed format 2-channel stereo plain DSD 3 frames in 14 sectors, Fixed format 2-channel stereo plain DSD 3 frames in 16 sectors, Lossless encoded flexible format. In the case that the frame format indicates that the frame structure has the Lossless encoded flexible format at least one frame in the Track Area may have been Lossless encoded.

An Audio Sector begins with an Audio Header and is followed by at least one Packet. The Audio Header comprises information about the Audio Sector, such as the number of Packets in the Audio Sector, the number of Audio Frames which begin in the Audio Sector, and a parameter which indicates whether the Audio Area to which the Audio Sector belongs has or does not have a frame format of the Lossless encoded flexible type. This parameter has been included in order to preclude some errors which can occur during reproduction of the Audio signals. The Audio Sector is the smallest unit that can be read from the information carrier. When the data on the record carrier is read by means of the file system the Audio Sectors can be read directly and it is not necessary to first read the Area TOC belonging to the Audio Area in which the Audio sector lies. This makes it possible to first read an Audio Sector having a frame structure of the type Fixed format 2-channel stereo plain DSD 3 frames in 14 sectors. The audio signals are then of the DSD type. DSD signals are 1-bit signals and can be applied directly to the output of the receiving device. If after reading of the afore-mentioned Audio Sector an Audio Sector is read which has a frame structure of the Lossless encoded flexible format type, the audio signals in this audio sector can be lossless encoded. If the lossless encoded signal is applied to the output, the applied signal may damage loudspeakers coupled to the receiving device. Therefore, during the read-out of each Audio Sector the receiving device must be capable of detecting whether the read-out data has been or has not been lossless encoded so as to enable the data thus read to be processed correctly.

In addition to information about the Audio Sector the Audio Header also comprises information about each Packet in the Audio Sector and information about each frame that begins in the Audio Sector. Information about an Audio Packet can be, for example, an indication whether the Packet is the first Packet of a Frame, the type of data in the Packet and the length of the Packet. The length can be represented, for example, as the number of bytes in the Packet. A Packet can contain only one data type, for example Audio Data, Supplementary Data or Padding Data. For each frame that begins in the Audio Sector the Audio Header contains frame information. Thus, each frame contains a time code. If the frame format is of the Lossless encoded flexible format type, the Audio Header of each frame which starts in the sector specifies the number of audio channels used, for example 2, 5 or 6 channels, and the number of audio sectors (N_sectors) over which the starting frame has been divided. If, for example, the first Packet of a Frame starts somewhere in sector X and the last packet is situated in Audio Sector Y, N_sectors is equal to Y−X+1. Before a receiving device can decode the Lossless encoded data it should first read all the packets belonging to a Frame. For this purpose, the information N-sectors is relevant.

An Audio Stream comprises the DSD audio signal in lossless encoded or non-lossless encoded form. An Audio Stream is the concatenation of all the Audio Frames in a Byte Stream. A Lossless encoded Audio Frame has a variable length. An Audio Frame in an Audio Area for which the Area TOC specifies that the frame format is of the Lossless encoded flexible format type starts with a bit which indicates whether the Audio Data appears in the Audio Frame in lossless encoded or non-lossless encoded form. Thus, it is possible that the Area TOC indicates that the frame format is of the Lossless encoded flexible format type and that all Audio Frames contain the Audio Data in non-lossless encoded form.

An apparatus in accordance with the invention may include both a transmitting device and a receiving device. The combination of the apparatuses shown in FIG. 4 and FIG. 5 yields an apparatus by means of which a digital information signal can be recorded on the record carrier and the recorded digital information signal can be read form the record carrier and can be reproduced at a later instant. Another possibility is that two apparatuses which both include a transmitting and receiving device communicate with one another via one or several transmission media. By means of its transmitting device the first apparatus transmits a digital information signal to the second apparatus via a first transmission medium. The second apparatus receives this signal by means of the receiving device and transfers it to the output. In a similar manner the second apparatus can transmit a digital information signal to the second apparatus via a second transmission medium. Depending on the physical implementation of the transmission medium use will be made of one or more transmission media.

The invention claimed is:

1. A transmitting device for transmitting a digital information signal via a transmission medium, comprising:
   input means for receiving the digital information signal,
   means for encoding the digital information signal and generating an output signal, wherein the encoding means are adapted to generate portions of the output signal in the form of encoded portions of the digital information signal under the influence of a first type of control signal, and are adapted to generate portions of the output signal in the form of portions of the digital information signal under the influence of a second type of control signal,
   means for generating a first identification signal of a first type which indicates that the output signal possibly includes a portion of the digital information signal which has been encoded in the encoding means, and a first identification signal of a second type which indicates that the output signal does not include any portions of the digital information signal which have been encoded by the encoding means,
   means for generating, for a portion of the digital information signal, a second identification signal of a first type in dependence on the first type of control signal and the first identification signal of the first type, and a second identification signal of a second type in dependence on the second type of control signal and the first identification signal of the first type,
   combining means for combining the output signal of the encoding means, the first identification signal and, if the first identification signal is of the first type, the second identification signal so as to obtain a composite signal to be applied to the transmission medium.

2. A transmitting device as claimed in claim 1, characterized in that the transmitting device further comprises means for determining whether encoding of a portion of the digital information signal leads to a data reduction by at least a predetermined factor, and in that the means for determining are adapted to generate the first type of control signal if encoding of said portion of the digital information signal leads to a data reduction larger than the predetermined factor.

3. A transmitting device as claimed in any one of the preceding claims, characterized in that the transmitting device further comprises error correction means and/or channel encoding means for error encoding and/or channel encoding of the composite signal into an error-encoded and/or channel-encoded signal, and recording means for recording the error-encoded and/or channel-encoded signal on a record carrier.

4. A method of transmitting a digital information signal via a transmission medium, comprising the steps of:
   receiving the digital information signal,
   encoding the digital information signal,
   generating portions of an output signal in the form of encoded portions of the digital information signal under the influence of a first type of control signal
   generating portions of the output signal in the form of portions of the digital information signal under the influence of a second type of control signal,
   generating a first type of first identification signal which indicates that the output signal possibly includes a portion of the digital information signal which has been encoded, or a second type of first identification signal which indicates that the output signal does not include any portions of the digital information signal which have been encoded,
   generating a first type of second identification signal in dependence on the first type of control signal and a the type of first identification,
   generating a second type of second identification signal in dependence on the second type of control signal and the first identification signal of the first type,
   combining the output signal, the first identification signal and, if the first identification signal is of the first type, the second identification signal so as to obtain a composite signal,
   applying the composite signal to the transmission medium.

5. A method of transmitting a digital information signal via a transmission medium, as claimed in claim 4, further comprising the steps of:
   error correction encoding and/or channel encoding of the composite signal,
   applying the error encoded and/or channel encoded signal to the transmission medium.

6. A method as claimed in claim 4 or 5, characterized in that the transmission medium is a record carrier.

7. A record carrier obtained by means of a method as claimed in claim 6, characterized in that the record carrier is an optical or magnetic recording medium.

8. A composite signal produced by the method of claim 4.

9. A transmission medium comprising the composite signal of claim 8.

10. A record carrier carrying a digital information signal that is readable by a processor device, the digital information signal having portions which have been or have not been encoded by means of a given encoding method, the record carrier further carrying a first identification signal which is of a first type which indicates that the record carrier possibly carries a portion of the digital information signal encoded by means of the given encoding method, the digital information signal providing the processor with an indicia for reproducing the digital information signal.

11. A record carrier as claimed in claim 10, characterized in that the record carrier carries a second identification signal for each portion of the digital information signal, a second identification signal of a first type indicating for a portion of the digital information signal that this portion has been encoded by means of the given encoding method and a second identification signal of a second type indicating for a portion of the digital information signal that this portion has not been encoded by means of the given encoding method.

12. A record carrier as claimed in claims 10 or 11 in the form of a disc, carrying digital information comprising at least one data area, each data area comprising a table of content and a track area, which track area comprises a representation of a digital information signal and has been divided into frames each comprising a portion of the representation of the digital information signal, characterized in that the table of content contains a first identification signal of a first or a second type, a first identification signal of a second type indicating that each frame in the track area contains a portion of the digital information signal which has not been encoded by means of the given encoding method and a first identification signal of a first type indicating that a frame in the track area possibly contains a portion of the digital information signal which has been encoded by means of the given encoding method, and in that if a data area contains a first identification signal of the first type each frame comprises a second identification signal which indicates whether the frame contains a portion of the digital information signal which has been or has not been encoded by means of the given encoding method.

13. A receiving device for receiving a composite signal via a transmission medium and for processing the composite signal into a digital information signal, comprising:
   receiving means for receiving the composite signal from the transmission medium,
   demultiplexing means for deriving at least one signal portion from the composite signal, the demultiplexing means are also adapted to derive a first identification signal of a first type and a second type from the composite signal,
   a decoder adapted to decode a signal portion into a portion of the digital information signal and to supply said portion of the digital information signal in dependence on a first type of control signal and to supply a signal portion as a portion of the digital information signal in a substantially unmodified form in dependence on a control signal is of a second type, and in that the receiving device further comprises:
   a delivery mechanism that routes the control signal for application to decoding means, which first-mentioned means generate a control signal of the first type in dependence on the first identification signal of the first type.

14. A receiving device as claimed in claim 13, characterized in that the demultiplexing means are adapted to derive a first identification signal of a second type from the composite signal, and in that the delivery mechanism generates the second type of control signal in dependence on the first identification signal of the second type.

15. A receiving device as claimed in claim 13 or 14, characterized in that the demultiplexing means are adapted to derive, in dependence on the identification signal of the first type, a second identification signal associated with each individual signal portion, and in that the delivery mechanism generates a control signal of the first type in dependence on the second identification signal of the first type and a control signal of the second type in dependence on the second identification signal of the second type.

16. A receiving device as claimed in claim 13 or 14, characterized in that the receiving device further comprises a device for reading out a signal recorded on a record carrier and channel decoding means and/or error detection/correction means for the channel decoding of the read-out signal and/or detecting and correcting errors in the read-out signal.

17. A receiving device as claimed in claim 15, characterized in that the receiving device further comprises a device for reading out a signal recorded on a record carrier and channel decoding means and/or error detection/correction means for the channel decoding of the read-out signal and/or detecting and correcting errors in the read-out signal.

18. A composite signal embedded in a carrier wave comprising:
   portions of a digital information signal, some portions of the digital information signal having been encoded by means of a given encoding method and other portions not having been encoded by means of the given encoding method;
   a first identification signal which is of a first type which indicates that a record carrier possibly carries a portion of the digital information signal encoded by means of the given encoding method; and
   indicia for reproducing the digital information signal.

19. The composite signal of claim 18, further comprising: a second identification signal for each portion of the digital information signal, a second identification signal of a first type indicating for a portion of the digital information signal that this portion has been encoded by means of the given encoding method, and a second identification signal of a second type indicating for a portion of the digital information signal that this portion has not been encoded by means of the given encoding method.

* * * * *